(12) United States Patent
Tyler et al.

(10) Patent No.: US 8,836,338 B2
(45) Date of Patent: Sep. 16, 2014

(54) SWITCHING CIRCUITS AND METHODS OF TESTING THEREOF

(75) Inventors: Peter Michael Tyler, Cheltenham Gloucestershire (GB); John Oliver Collins, Cheltenham Gloucestershire (GB)

(73) Assignee: GE Aviation Systems Limited (GB)

(*) Notice: Subject to any disclaimer, the term of this patent is extended or adjusted under 35 U.S.C. 154(b) by 349 days.

(21) Appl. No.: 13/328,018

(22) Filed: Dec. 16, 2011

(65) Prior Publication Data

US 2013/0154717 A1    Jun. 20, 2013

(51) Int. Cl.
*G01R 31/02* (2006.01)

(52) U.S. Cl.
USPC .......................................... 324/418; 324/713

(58) Field of Classification Search
None
See application file for complete search history.

(56) References Cited

U.S. PATENT DOCUMENTS

| | | | |
|---|---|---|---|
| 4,752,886 A * | 6/1988 | Gareis | 700/293 |
| 6,304,189 B1 | 10/2001 | Koch et al. | |
| 7,538,454 B2 | 5/2009 | Yu et al. | |
| 7,586,725 B2 | 9/2009 | DiVito et al. | |
| 7,598,625 B2 | 10/2009 | Yu et al. | |
| 7,741,883 B2 | 6/2010 | Fuller et al. | |
| 2003/0025515 A1 | 2/2003 | Mulera et al. | |
| 2004/0160131 A1 | 8/2004 | Veil et al. | |

OTHER PUBLICATIONS

Komatsu, M.; Ide, N.; Yanabu, S. "A Solid-State Current Limiting Switch for Application of Large-scale Space Power Systems." Power Electronics Specialists Conference, Jun. 17-21, 2007; pp. 1471-1476.

* cited by examiner

*Primary Examiner* — Minh N Tang
(74) *Attorney, Agent, or Firm* — GE Global Patent Operation; Mark A. Conklin

(57) ABSTRACT

A switching circuit for connection to a load and to a voltage source is provided. The switching circuit includes at least one switching device for switching on and off power to the load. A pulldown device is provided for shorting out the load thereby isolating the load from the voltage source; and a controller operable while the load is shorted to activate at least one of the switching devices at a time. The current passes through the activated switching device and is measurable to test whether the activated switching device is operating correctly.

14 Claims, 2 Drawing Sheets

SWITCHING CIRCUITS AND METHODS OF TESTING THEREOF

BACKGROUND OF THE INVENTION

1. Field of the Invention

The present disclosure relates to switching circuits and methods of testing thereof.

2. Description of the Prior Art

Often, switching circuits include several switching devices connected in parallel with one another whereby the current capacity of the switching circuit is the sum of the capacities of each switching device. This is particularly useful for applications in which the power required by the load exceeds the capacity of a single switching device. One example of such switching circuits is found in aircraft power distribution systems, wherein for example eight solid-state switching devices may be provided in parallel. Generally, the switching devices can fail open or closed. Each switching device has a driver which can be the cause of the failure. If one or more of the switching devices fails open the others can act as backup switches, but potentially may be subjected to current overload. If one or more of the switching devices fails closed, it would not be possible to switch off the switching circuit and it would be readily apparent that such a failure had occurred. If failed open, the failure may be undetectable. Solid-state switching devices are tested thoroughly at the manufacturing stage, but it is desirable to be able to test them in service to ensure that they remain fully functional. This is also known as a built-in-test (BIT).

BRIEF SUMMARY OF THE INVENTION

According to an embodiment of the present invention, a switching circuit for connection to a load and to a voltage source is provided. The switching circuit comprises: at least one switching devices for switching on and off power to the load a pulldown device for shorting out the load thereby isolating the load from the voltage source; and a controller operable while the load is shorted to activate at least one of the switching devices at a time, wherein a current passes through the activated switching device and is measurable to test whether the activated switching device is operating correctly.

According to another embodiment of the present invention, a method of testing a switching circuit that connects a load to a voltage source, the switching circuit comprising at least one switching device, is provided. The method comprises: shorting out the load by activating a pulldown device; activating at least one of the at least one switching devices; measuring the current through the at least one switching device that is activated; and determining from the measured current signal whether the at least one activated switching device is operating correctly.

BRIEF DESCRIPTION OF THE DRAWINGS

Embodiments of the present invention will now be described, by way of example only, with reference to the accompanying drawings, in which.

DETAILED DESCRIPTION OF THE INVENTION

Figure 1:
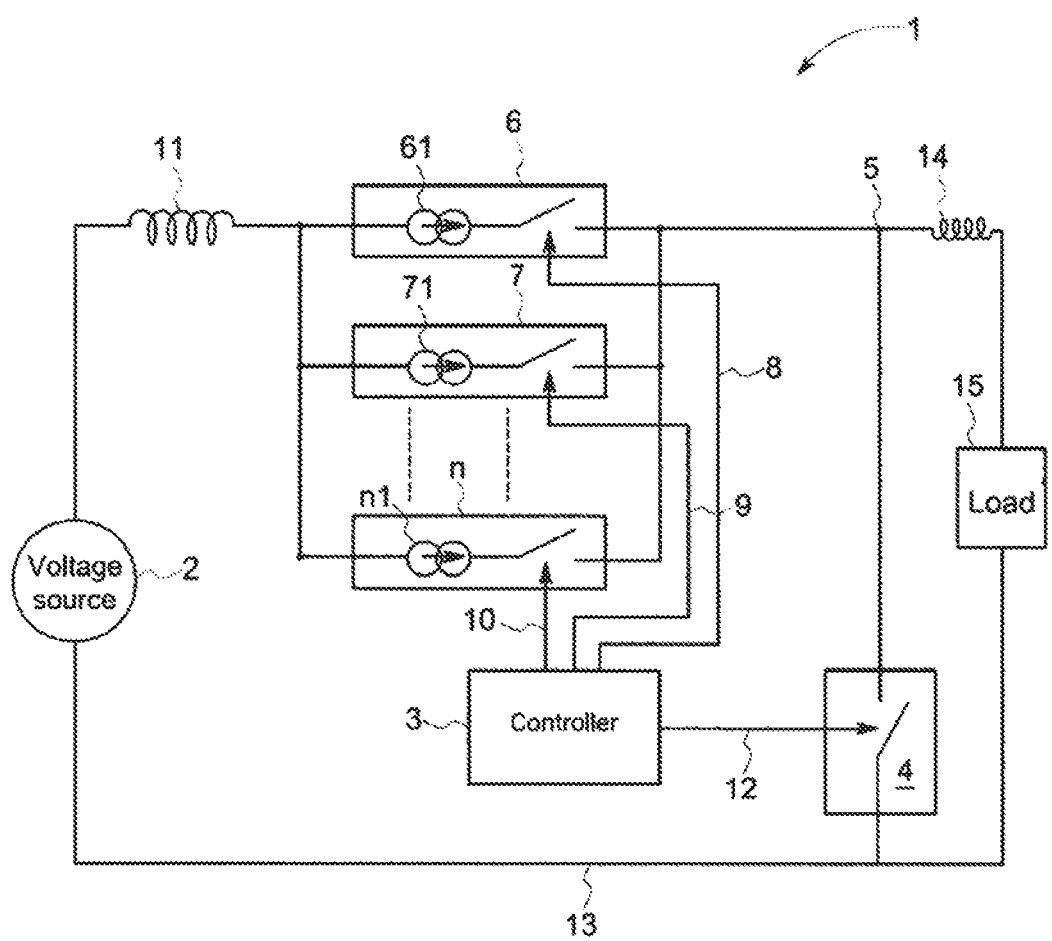
FIG. 1 shows schematically a circuit including a switching circuit exemplifying an embodiment of the present invention.

FIG. 1 illustrates an example of a circuit comprising a switching circuit 1 connected to a voltage source 2. The circuit has an output 5 which is connected to a load 15. The circuit may, for example, be provided on an aircraft such that the voltage source 2 may be provided by an engine generator and the load 15 may be a component on the aircraft, such as to actuate a landing gear flap or the under carriage or a component within the aircraft such as instrumentation or in-flight entertainment. The switching circuit 1 may comprise an individual switching device 6, or a plurality of switching devices 6, 7, ..., n. The switching devices are connected in parallel. The switching devices may each comprise any suitable solid-state switching device such as a field effect transistor. The switching circuit 1 is used to connect the power source 2 to the load 15. The voltage source 2 and its associated cabling or wiring will have an inherent inductance 11. Likewise, the load and its associated cabling and wiring will have an inherent inductance 14.

The switching circuit further includes a controller 3 which is connected to each of the switching devices 6, 7, ..., n via respective control lines 8, 9, 10. The controller 3 is also connected to a pulldown device 4 via, a pulldown control line 12. The pulldown device 4 is further connected to the load output 5 and the power return line 13. When the pulldown 4 is closed it shuts off the load from the switching circuit, and diverts current through the pulldown 4. The pulldown device, also referred to as a pulldown circuit or simply a pulldown, can include any appropriate switch, including electronic, electromechanical and mechanical switches.

The switching circuit 1 may comprise a solid-state power controller (SSPC), which may comprise one or a plurality of connected semiconductor devices. If it comprises a plurality of parallel connected semiconductor devices, each device may be switched on and off sequentially so that each of the plurality of devices may be tested individually. Other test sequences can be envisaged, such as activating more than one switching device at once. Individual activation of the switching devices allows fault isolation to an individual switch. The testing sequence can be carried out at any convenient time, such as in between flights. The testing sequence could also be carried out in-flight during times when the load 15 is not required.

Each of the switching devices 6, 7, ..., n includes a respective current limiter 61, 71, ..., n1. The current limiters restrict the current passing through the switching devices to on the order of five to ten times the normal maximum operating current to avoid damage to the switching devices. Alternatively, a single current limiter for all of the switching devices could be provided. In a further alternative, a hard current trip could be provided to turn off the switching devices when the trip limit is exceeded.

The pulldown circuit is activated whenever any of the switching devices are activated for the BIT testing routine. Each switching device and its drive circuitry may be fully tested by using the controller 3 to activate one device at a time while simultaneously checking that the current flowing through it and through the pulldown device is within the correct limits. The current measuring circuitry is not shown in FIG. 1. In one particular embodiment, the minimum time for which each switching device is activated is chosen to be at least the time required for the current to become relatively constant to allow consistent measurement of this current to the accuracy required by the BIT system. The time for which each switching device is activated is generally dependent on the maximum total inductance 11 in the input power source cable. However, the system can be operated on shorter timescales if desired.

The pulldown device is designed so that when it sinks the current from a single main switching device during the BIT test, the voltage developed at the output 5 to the load is negligible compared to the normal output voltage when the system is on. This ensures that the load is not subjected to significant voltage when the system is supposed to be off. This is achieved by using a pulldown device 4 that has a lower impedance than each switching device, preferably much lower. In practice, when the current limiters 61, 71, . . . , n1 are in operation, the switching devices 6, 7, . . . , n have a higher effective impedance than the pulldown device 1. During normal system operation, the controller 3 which activates the switching devices 6, 7, . . . , n would generally be expected to turn all of the switching devices on and off simultaneously.

Embodiments of the invention apply not only to DC systems but also AC systems. In this case the voltage source 2 would be an alternating voltage. The switching devices would be AC switches (optionally with AC current limiters) and the pulldown circuit would be capable of sinking AC currents. In a DC embodiment, the pulldown device comprises a field effect transistor (FET) or, a bipolar transistor, or an insulated gate bipolar transistor for example. Other types of switching device can be used. In an AC embodiment, the pulldown device may comprise a triac or a solid state relay for example.

Figure 2:
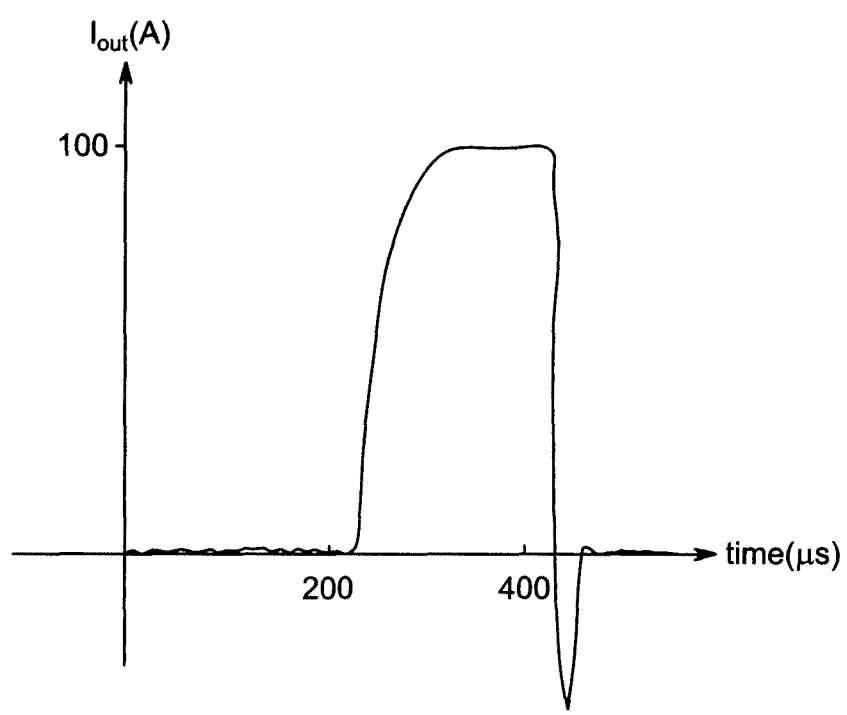
FIG. 2 is a graph of current against time during a test procedure carried out on the circuit of FIG. 1.

FIG. 2 illustrates the output current through a switching device when a test procedure is performed. Only one peak is shown, but in an exemplary embodiment eight switching devices are provided so the test would result in a total input current from the voltage source 2 which shows 8 sequential pulses like the single one shown in FIG. 2. The correct operation of each switching device 6, 7, . . . , n may be determined by checking the amplitude of each individual current pulse is within the correct limits.

The test procedure begins by shorting out the load by activating the pulldown device 4. The pulldown device will generally remain on for the duration of the BIT test. The first switching device 6 is closed at about 250 μs in the example shown, and the current through the switching device 6 quickly rises to that provided by the source 2, in this example approximately 100 Amps. The first switching device 6 is then opened and a short time later, the second switching device 7 is closed and the current through the second switching device 7 is measured. This procedure is repeated in sequence until all of the switching devices have been tested. Differences in the current profiles to the ones shown in FIG. 2 may indicate a fault with the corresponding switching device.

Advantageously, embodiments of the invention allow individual assessment of the operation of the switching devices. A simple BIT test which just checks the overall solid state power controller operation would not normally be able to detect a faulty device which was stuck in the open circuit state. A technical advantage of this invention is that not only does it detect single device failures but also can check the current limiting performance of each device individually. The invention can therefore provide complete BIT coverage during in-service operation.

In an alternative embodiment the switching devices do not have current limit control. In this case the inductance of the power source 2 and cable inductance 11 can be relied on in combination with a fast current trip circuit to prevent the current rising to dangerous levels during the test pulse. In other words, the controller 3 in this embodiment would operate to activate the sequence of opening and closing the switching devices quickly enough to avoid current overload.

The invention claimed is:

1. A switching circuit for connection to a load and to a voltage source, the switching circuit comprising:
   at least one switching device for switching on and off power to the load;
   a pulldown device for shorting out the load thereby isolating the load from the voltage source; and
   a controller operable while the load is shorted to activate at least one of the at least one switching device,
   Wherein a current passes through the activated switching device and is measurable to test whether the activated switching device is operating correctly, and
   wherein the impedance of the pulldown device is less than the impedance of the at east one switching device.

2. The switching circuit according to claim 1, wherein the pulldown device comprises a switch disposed in parallel with the load, wherein closure of the switch shorts out the load.

3. The switching circuit according to claim 2, wherein the pulldown device comprises an electronic, electromechanical and/or mechanical switch, including any one or more of a field effect transistor, a bipolar transistor, an insulated gate bipolar transistor, a triac, and a solid state relay.

4. The switching circuit according to claim 1, wherein the at least one switching device is activated individually.

5. The switching circuit according to claim 1, further comprising a current limiter for restricting the current through the at least one switching device.

6. The switching circuit according to claim 5, wherein the at least one switching device comprise a current limiter disposed therein.

7. The switching circuit according to claim 1, wherein system inductance is used to restrict the current through the at least one switching device.

8. The switching circuit according to claim 1, wherein an output voltage of the at least one switching device under test condition[s] is negligible compared to an output voltage in normal operating condition[s].

9. The switching circuit according to claim 1, wherein the switching circuit is connectable to an AC or a DC voltage source.

10. The switching circuit according to claim 1, wherein the at least one switching device comprises a solid state switching device.

11. A method of testing a switching circuit that connects a load to a voltage source, the switching circuit comprising at least one switching device, the method comprising:
   shorting out the load by activating a pulldown device;
   activating at least one of the at least one switching devices;
   measuring the current through the at least one switching device that is activated; and
   determining from the measured current whether the at least one activated switching device is operating correctly, wherein the impedance of the pulldown device is less than the impedance of the at least one switching device.

12. The method according to claim 11, wherein the switching devices are activated sequentially one after another.

13. The method according to claim 11, wherein the at least one switching device is activated for a time sufficient for the current flowing therethrough to become substantially constant.

14. The method according claim 11, further comprising restricting the current that passes through the at least one switching device.

* * * * *

UNITED STATES PATENT AND TRADEMARK OFFICE
CERTIFICATE OF CORRECTION

| | | |
|---|---|---|
| PATENT NO. | : 8,836,338 B2 | Page 1 of 1 |
| APPLICATION NO. | : 13/328018 | |
| DATED | : September 16, 2014 | |
| INVENTOR(S) | : Tyler et al. | |

It is certified that error appears in the above-identified patent and that said Letters Patent is hereby corrected as shown below:

On the title page, under item 73 "Assignee", in Column 1, Line 1, delete "Limited" and insert -- Limited, Cheltenham Gloucestershire --, therefor.

On the title page, below item (65), insert item -- (30) Foreign Application Priority Data December 17, 2010 (GB)............. 1021453.4 --.

In the specification

In Column 2, Line 20, delete "via, a" and insert -- via a --, therefor.

In Column 3, Line 9, delete "pulldown device 1." and insert -- pulldown device 4. --, therefor.

In Column 3, Line 20, delete "or, a" and insert -- or a --, therefor.

In the claims

In Column 4, Line 10, in Claim 1, delete "Wherein" and insert -- wherein --, therefor.

In Column 4, Line 13, in Claim 1, delete "at east" and insert -- at least --, therefor.

In Column 4, Line 60, in Claim 14, delete "according" and insert -- according to --, therefor.

Signed and Sealed this
Second Day of February, 2016

Michelle K. Lee
*Director of the United States Patent and Trademark Office*